United States Patent [19]

Baumgartner et al.

[11] Patent Number: 5,712,580
[45] Date of Patent: Jan. 27, 1998

[54] LINEAR PHASE DETECTOR FOR HALF-SPEED QUADRATURE CLOCKING ARCHITECTURE

[75] Inventors: Steven John Baumgartner; Matthew James Paschal, both of Rochester, Minn.

[73] Assignee: International Business Machines Corporation, Armonk, N.Y.

[21] Appl. No.: 599,997

[22] Filed: Feb. 14, 1996

[51] Int. Cl.[6] ............................................. H03D 13/00
[52] U.S. Cl. .................... 327/12; 327/144; 327/238; 327/254; 370/518; 370/544; 375/371; 375/373
[58] Field of Search .................. 327/2, 3, 7, 10, 327/12, 141, 144, 147, 148, 150, 159, 231, 237, 238, 254, 255; 375/371, 373, 375, 376, 359, 362, 364; 370/518, 544

[56] References Cited

U.S. PATENT DOCUMENTS

| | | | |
|---|---|---|---|
| 3,895,294 | 7/1975 | Vinding | 324/76.82 |
| 4,237,423 | 12/1980 | Rhodes | 327/7 |
| 4,267,514 | 5/1981 | Kimsey | 327/7 |
| 4,371,974 | 2/1983 | Dugan | 375/328 |
| 4,380,083 | 4/1983 | Andersson et al. | 375/376 |
| 4,380,815 | 4/1983 | Clendening | 375/327 |
| 4,663,769 | 5/1987 | Krinock | 375/359 |
| 4,932,041 | 6/1990 | Eiberger et al. | 375/376 |
| 4,975,660 | 12/1990 | Svenson | 331/1 A |
| 5,022,057 | 6/1991 | Nishi et al. | 375/373 |
| 5,027,085 | 6/1991 | DeVito | 331/1 A |
| 5,126,602 | 6/1992 | Lee et al. | 327/10 |
| 5,150,364 | 9/1992 | Negus | 370/542 |
| 5,233,636 | 8/1993 | Lee et al. | 375/373 |
| 5,297,173 | 3/1994 | Hikmet et al. | 375/371 |
| 5,301,196 | 4/1994 | Ewen et al. | 370/518 |
| 5,302,916 | 4/1994 | Pritchett | 331/1 A |
| 5,406,592 | 4/1995 | Baumert | 375/376 |
| 5,436,938 | 7/1995 | Pigeon | 375/376 |
| 5,479,456 | 12/1995 | Rhebergen | 375/361 |
| 5,550,878 | 8/1996 | Shigaki et al. | 375/373 |

*Primary Examiner*—Timothy P. Callahan
*Assistant Examiner*—Kenneth B. Wells
*Attorney, Agent, or Firm*—Joan Pennington; Karuna Ojanen

[57] ABSTRACT

A linear phase detector used with half-speed quadrature clock architecture is provided. The linear phase detector includes a first circuit receiving a data signal, a first half-speed quadrature clock signal and a second half-speed quadrature clock signal. The first circuit generates an adjusted data signal and a polarity representing signal of the first half-speed quadrature clock signal. A high speed phase detector is coupled to the first circuit for generating a linear phase correction signal.

16 Claims, 4 Drawing Sheets

LINEAR PHASE DETECTOR FOR HALF-SPEED QUADRATURE CLOCKING ARCHITECTURE

CONTRACTUAL ORIGIN OF THE INVENTION

The United States Government has rights in this invention pursuant to Cooperative Agreement Number F 33615-94-2-1582 between the United States Air Force and INTERNATIONAL BUSINESS MACHINES CORPORATION.

FILED OF THE INVENTION

The present invention relates to linear phase detectors and more particularly to a linear phase detector used with half-speed quadrature clock architecture to phase align to random data.

DESCRIPTION OF THE PRIOR ART

In digital systems, with nonreturn-to-zero (NRZ) data streams, the technology can be optimized by sampling the data with half data rate clocks or half-speed clocks since the bandwidth of the data equals the bandwidth of the clocks. A problem with half-speed clocks and random data is that either a rising edge or a falling edge of the data is in-phase with the clock edge being aligned with the data. This problem may be understood having reference to FIG. 2, where NRZ data and a half-speed clock signal are shown in the upper two signal lines labelled DATA and C00.

Another problem in high speed communication systems is there are very tight jitter requirements. These tight jitter requirements are more difficult to achieve when the clock is embedded in a random bit stream and must be recovered by a receiving end phase locked loop (PLL). Digital voltage controlled oscillators (VCOs) and digital PLLs do not offer enough resolution to solve this problem.

U.S. Pat. No. 5,301,196 issued to Ewen et al., on Apr. 5, 1994 and assigned to the present assignee, discloses a half-speed clock recovery and demultiplexer circuit. The half-speed clock recovery and demultiplexer circuit includes two half-speed clock signals offset by 90 degrees with respect to each other. A digital phase comparator includes two edge triggered flip-flops which sample the in-phase and quadrature-phase clocks, at the time of transitions in the data and an exclusive-OR gate which provides a phase comparison signal that indicates whether the generated clock leads or lags the received data. A 1:2 demultiplexer function is provided by two retiming latches, one triggered on the rising edge of the quadrature-phase clock and the other triggered on the falling edge of the quadrature-phase clock. While the disclosed phase detection arrangement provides improvements over other known clock recovery circuits, correction errors result because the phase comparator continuously issues a leading or lagging correction signal with no null state, even when there are no data transitions. This results in more jitter and shorter PLL coast times than a linear phase detector.

A linear phase detector advantageously is used to provide lower jitter and longer phase-locked loop (PLL) coast times. It is highly desirable to combine the advantages of a linear phase detector together with half-speed quadrature clocking architecture.

SUMMARY OF THE INVENTION

A principal object of the present invention is to provide a linear phase detector used with half-speed quadrature clocking architecture. Other objects are to provide such linear phase detector substantially without negative effects and that overcomes many of the disadvantages of prior art arrangements.

In brief, a linear phase detector used with half-speed quadrature clock architecture is provided. The linear phase detector includes a first circuit receiving a data signal, a first half-speed quadrature clock signal and a second half-speed quadrature clock signal. The first circuit generates an adjusted data signal and a polarity representing signal of the first half-speed quadrature clock signal. A phase detector is coupled to the first circuit for generating a linear phase correction signal.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
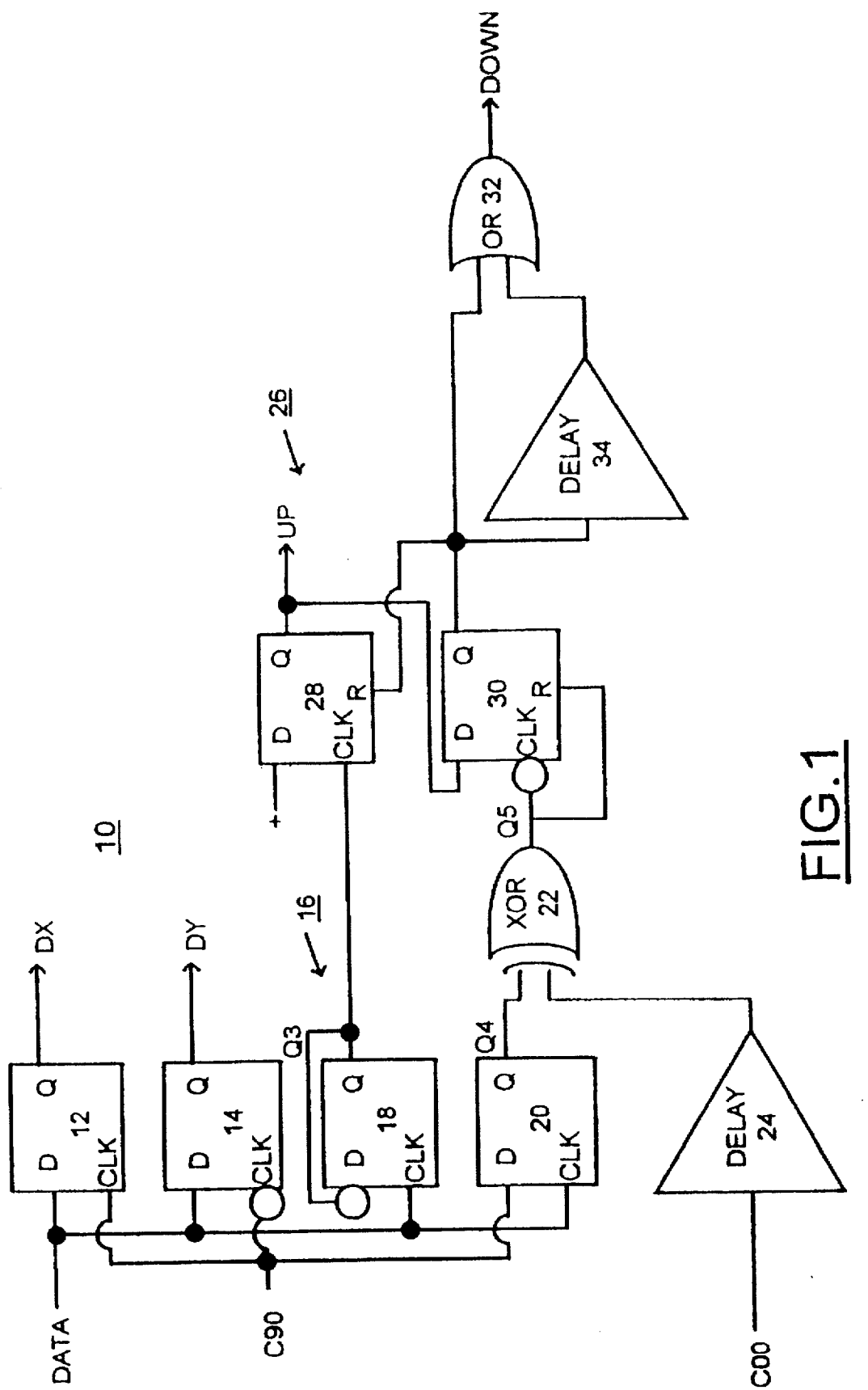
FIG. 1 schematic diagram representation of a linear phase detector in accordance with the invention.

Having reference now to the drawings, FIG. 1 illustrates a linear phase detector in accordance with the invention generally designated by the reference character 10. The linear phase detector 10 is used with a half-speed quadrature clock architecture to phase align to random data. Linear phase detector 10 receives a first half-speed clock signal C00, a second half-speed clock signal C90, and a data signal DATA. The half-speed clock signals C00 and C90 are quadrature signals or clock signal offset by 90 degrees. An oscillator (not shown), such as, a voltage controlled oscillator (VCO) at half the data rate, can be used to generate the half-speed quadrature clock signals C00 and C90.

In accordance with features of the invention, tighter jitter requirements are enabled by the linear phase detector 10 because correction pulses at lines UP and DOWN are only proportional to the phase difference between the clock C00 and DATA signals and are relatively high frequency pulses that are rolled off by a low pass loop filter (not shown) that can be used to adjust the oscillator frequency. Linear phase detector 10 predicts which clock signal edge of the half-speed quadrature clock signal C00 is in-phase with the data edge and then inverts the clock signal C00 (if needed) to generate the correction pulses UP and DOWN accurately.

Linear phase detector 10 includes a pair of retiming latches 12 and 14 that are clocked with the C90 clock signal and perform a 1:2 demultiplexer function on the data signal providing an output DX and DY, respectively. A first clock polarity predicting circuit generally designated by the reference character 16 includes a pair of D-type positive edge triggered flip-flops 18 and 20 and an exclusive OR (XOR) gate 22. To accurately generate an adjusted data signal, the DATA signal is divided down by the first flip-flop 18. First flip-flop 18 is arranged as a divide-by-two with the DATA signal applied to an input CLK of flip-flop 18 and an output Q of flip-flop 18 at line Q3 applied to an inverted input D of flip-flop 18. The output Q3 of flip-flop 18 goes high with a first rising edge of the DATA signal and is reset on a next second rising edge of the DATA signal.

The DATA signal is used to sample the polarity of the clock signal C90 with the second flip-flop 20. The DATA signal is applied to an input CLK of flip-flop 20 with the clock signal C90 applied to an input D of the flip-flop 20. An output Q at line Q4 of the second flip-flop 20 goes high on the rising edge of the DATA signal when the clock signal C90 is high. Flip-flop 20 is reset and the output Q4 goes low on the rising edge of the DATA signal when the clock signal C90 is low. In this fashion, a polarity representing signal of clock signal C90 is generated. By sampling the clock signal C90 with the DATA signal, the correct polarity of the clock signal C00 is predicted. The output signal Q4 of flip-flop 20 is applied to a first input of the exclusive OR (XOR) gate 22 and is XORed with the clock signal C00 to select an appropriate polarity of clock-signal C00. The clock signal C00 is applied via a first delay gate 24 to a second input of XOR gate 22.

A high speed phase detector circuit generally designated by 26 is provided by a pair of latches 28 and 30. A high speed phase detector advantageously used for the high speed phase detector 26 is described in "HIGHSPEED PHASE DETECTOR" by R. L. Deremer, L. W. Freitag and D. W. Siljenberg, IBM Technical Disclosure Bulletin, Vol. 33, No. 4, pps. 259–261 Sep, 1990.

The output Q3 of the first flip-flop 18 is applied to an input CLK of latch 28. An UP signal is generated at an output Q of latch 28 upon every rising edge of the output Q3 of the first flip-flop 16 which corresponds to every other rising edge in the DATA signal. The XOR output signal Q5 of XOR gate 22 is applied to an input CLK of the latch 30 for providing the correct polarity of clock signal C00. An input D of latch 28 is held high. The UP signal output of latch 28 sets an input D of the latch 30 to high. The rising edge of the DOWN signal resets the UP signal. The output Q of latch 30 is applied to an first input of an OR gate 32 to generate a DOWN signal proportional to the C00 pulse width. The output Q of latch 30 is applied to a reset input R of latch 28 and a second delay gate 28. The output of delay gate 34 is applied to the second input of OR gate 32. The delay gates 24 and 34 are fixed delay cells. The delay gates 24 and 34 are used to stretch the UP and DOWN pulses, respectively, to compensate for technology dependent delays and tune out any static phase error.

Figure 2:
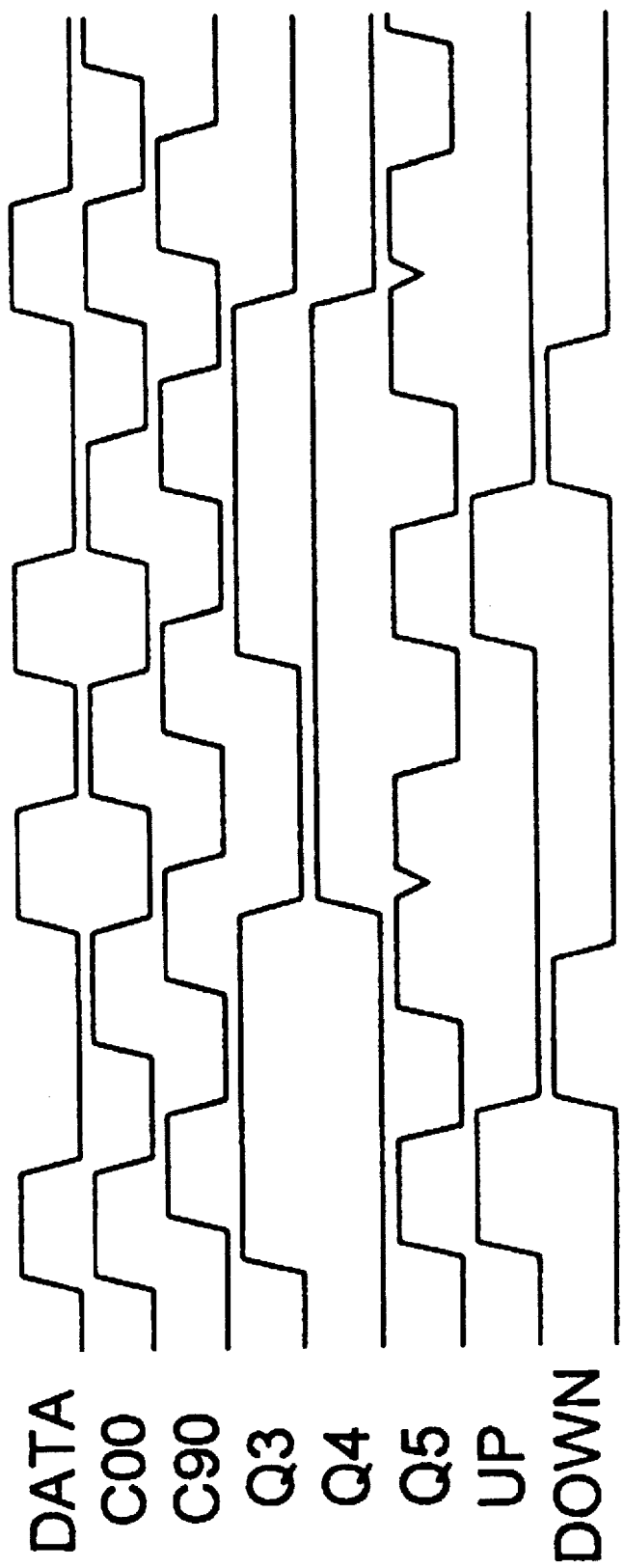
FIG. 2 is a timing diagram for the linear phase detector of FIG. 1 illustrating data phase locked to a quadrature clock signal.
Figure 3:
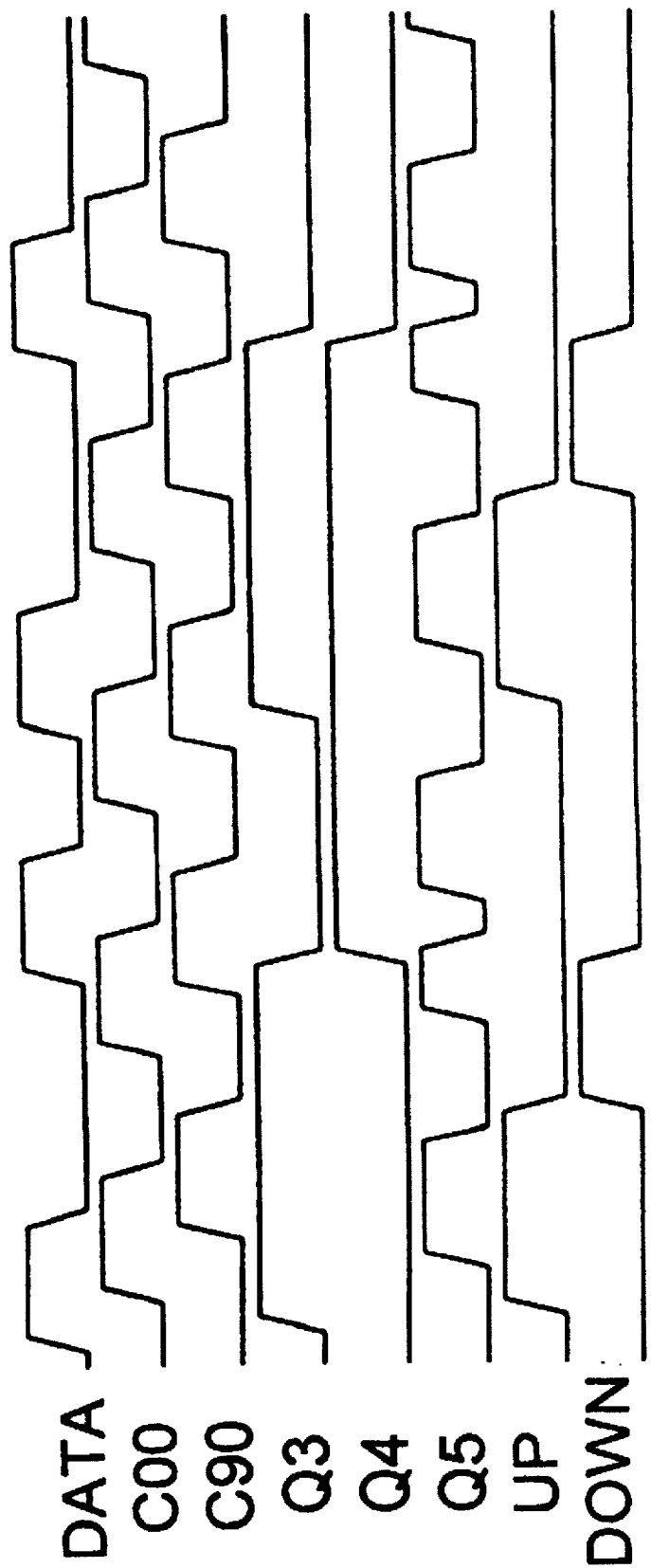
FIG. 3 is a timing diagram for the linear phase detector of FIG. 1 illustrating data leading the quadrature clock signal.
Figure 4:
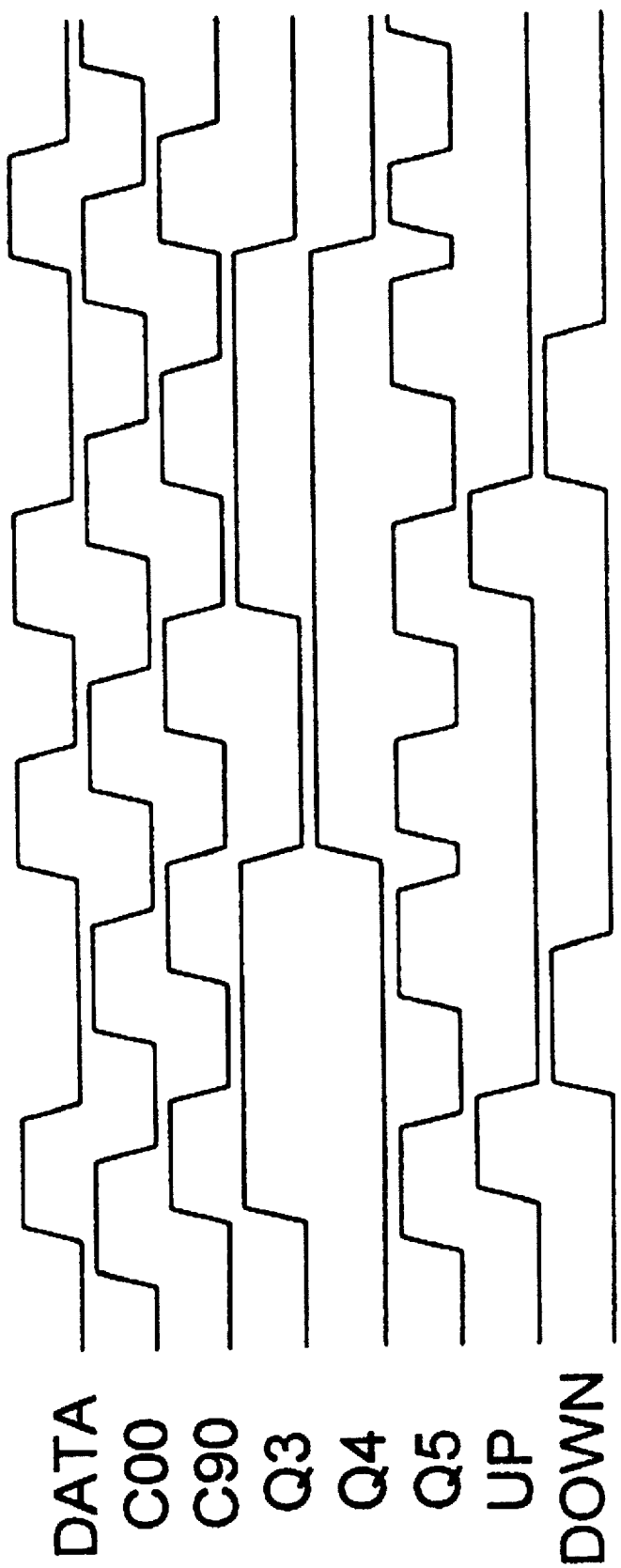
FIG. 4 is a timing diagram for the linear phase detector of FIG. 1 illustrating data lagging the quadrature clock signal.

Referring now to FIGS. 2, 3 and 4, respective timings of outputs Q3, Q4, Q5, UP and DOWN are shown relative to the DATA signal and the half-speed quadrature clock signals C00 and C90. The half-speed quadrature clock signal C90 is 90 degrees offset from clock signal C00 and is used as a strobe to sample the DATA signal and also is used as an input to the clock polarity predicting circuit 16. The output Q3 of flip-flop 18 corresponds to the DATA signal divided by two. The output Q4 of flip-flop 20 corresponds to the polarity of clock signal C00 generated with the clock signal C90 sampled with the DATA signal. The output Q5 of XOR gate 22 provides an inversion of the clock signal C00 as required. The UP signal output of latch 28 is proportional to the phase difference between the DATA signal and the clock signal C00. The DOWN signal of OR gate 32 is proportional to the clock signal C00.

FIG. 2 illustrates the DATA signal phase locked to the half-speed quadrature clock signal C00. The half-speed quadrature clock signal C90 is aligned in the middle of the DATA signal. The DOWN signal is equal in width to the UP signal to provide an average correction value of zero.

FIG. 3 shows the timings for the linear phase detector 10 in the cases where the DATA phase leads the clock signal C00. The width of the UP signal is greater than the DOWN signal to provide a positive average correction value to increase the clock oscillator frequency and bring the clock signal C00 in-phase alignment with the DATA signal.

FIG. 4 shows the timings for the linear phase detector 10 in the cases where the DATA phase lags the clock signal C00. The width of the UP signal is less than the DOWN signal to provide a negative average correction to decrease the clock oscillator frequency and bring the clock signal C00 in-phase alignment with the DATA signal.

While the present invention has been described with reference to the details of the embodiments of the invention shown in the drawing, these details are not intended to limit the scope of the invention as claimed in the appended claims.

What is claimed is:

1. A linear phase detector used with half-speed quadrature clock architecture comprising:
    a first circuit for receiving a data signal, a first half-speed quadrature clock signal, and a second half-speed quadrature clock signal; said first circuit comprising:
    means, responsive to said data signal, for generating an adjusted data signal;
    means, responsive to said data signal and said second half-speed quadrature clock signal, for generating a polarity representing signal of said second half-speed quadrature clock signal; and
    means, responsive to said polarity representing signal, for selecting an appropriate polarity of said first half-speed quadrature clock signal; and
    a phase detector coupled to said first circuit for generating a linear phase correction.

2. The linear phase detector as recited in claim 1 wherein said means, responsive to said data signal, for generating said adjusted data signal comprises a flip-flop configured as a divide by two.

3. The linear phase detector as recited in claim 1 wherein said means, responsive to said data signal, for generating said adjusted data signal comprises an edge triggered D-type flip-flop configured to provide a rising edge on alternate rising edges of said data signal.

4. The linear phase detector as recited in claim 1 wherein said means, responsive to said data signal and said second half-speed quadrature clock signal, for generating said polarity representing signal of said second half-speed quadrature clock signal comprises a flip-flop for sampling said second half-speed quadrature clock signal with said data signal.

5. The linear phase detector as recited in claim 4 wherein said means, responsive to said polarity representing signal, for selecting said appropriate polarity of said first half-speed quadrature clock signal comprises an exclusive OR gate for XORing an output of said flip-flop with said first half-speed quadrature clock signal.

6. The linear phase detector as recited in claim 1 wherein said phase detector coupled to said first circuit for generating said linear phase correction signal comprises a pair of latches.

7. The linear phase detector as recited in claim 6 wherein said adjusted data signal is applied to a first one of said pair of latches for generating an UP correction signal.

8. The linear phase detector as recited in claim 7 wherein said appropriate polarity of said first half-speed quadrature clock signal is applied to a second one of said pair of latches for generating a DOWN correction signal.

9. A linear phase detector for use with half-speed quadrature clock architecture including a first half-speed quadrature clock signal and a second half-speed quadrature clock signal, the first and second half-speed quadrature clock signals being half-speed of a received data rate, said linear phase detector comprising:

a first circuit receiving the data signal, the first half-speed quadrature clock signal and the second half-speed quadrature clock signal; said first circuit comprising:

first means, receiving the data signal, for generating an adjusted data signal;

second means, receiving the data signal and the second half-speed quadrature clock signal, for generating a polarity representing signal of the second half-speed quadrature clock signal; and means, responsive to said polarity representing signal, for selecting an appropriate polarity of the first half-speed quadrature clock signal; and a phase detector coupled to said first circuit for generating a linear phase correction signal.

10. The linear phase detector as recited in claim 9 wherein said first means for generating an adjusted data signal comprises a flip-flop configured as a divide by two.

11. The linear phase detector as recited in claim 9 wherein said second means for generating a polarity representing signal comprises a flip-flop configured for sampling the second half-speed quadrature clock signal with the data signal and wherein said means responsive to said polarity representing signal comprises an exclusive OR gate for XORing an output of said flip-flop with said first half-speed quadrature clock signal.

12. The linear phase detector as recited in claim 9 wherein said phase detector comprises a first latch receiving said generated adjusted data signal for generating an UP correction signal, and second latch receiving said appropriate polarity of said first half-speed quadrature clock signal for generating a DOWN correction signal, and wherein said generated UP correction signal is proportional to a phase difference between the data signal and the first half-speed quadrature clock signal and said generated DOWN correction signal is proportional to a width of the first half-speed quadrature clock signal.

13. The linear phase detector as recited in claim 9 comprising a demultiplexer to a demultiplex the data signal; said demultiplexer comprising a pair of retiming latches clocked by the second half-speed quadrature clock signal.

14. A linear phase detector using a first half-speed quadrature clock signal and a second half-speed quadrature clock signal, said linear phase detector comprising: a demultiplexer to demultiplex a data signal; said demultiplexer comprising a pair of retiming latches docked by the second half-speed quadrature clock signal;

a first flip-flop receiving the data signal for generating a divided by two data signal;

a second flip-flop receiving the data signal and the second half-speed quadrature clock signal for generating a polarity representing signal of the second half-speed quadrature clock signal;

an exclusive OR gate for XORing an output of said second flip-flop and the first half-speed quadrature clock signal; and a phase detector coupled to an output of said first flip-flop and said exclusive OR gate for generating a linear phase correction signal.

15. A linear phase detector for use with half-speed quadrature clock architecture comprising:

a first circuit for receiving a data signal, a first half-speed quadrature clock signal, and a second half-speed quadrature clock signal; said first circuit comprising:

an adjusted data signal generator to generate an adjusted data signal responsive to the data signal;

a polarity signal generator receiving as inputs the data signal and the second half-speed quadrature clock signal to generate a polarity signal representative of the second half-speed quadrature clock signal;

a selector connected to the polarity signal generator and the first half-speed quadrature clock to select an appropriate polarity of the first half-speed quadrature clock signal; and a phase detector coupled to the first circuit for generating a linear phase correction signal.

16. The linear phase detector of claim 15 wherein the linear phase correction signal comprises a first signal proportional to a phase difference between the data signal and the first half-speed quadrature clock signal, and a second signal proportional to a width of the first half-speed quadrature clock signal.

* * * * *